(12) United States Patent
Brindle

(10) Patent No.: US 7,786,787 B2
(45) Date of Patent: Aug. 31, 2010

(54) SERIES/SHUNT SWITCH AND METHOD OF CONTROL

(75) Inventor: Christopher N. Brindle, Dracut, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 11/821,204

(22) Filed: Jun. 22, 2007

(65) Prior Publication Data

US 2007/0247211 A1 Oct. 25, 2007

Related U.S. Application Data

(63) Continuation of application No. 10/648,022, filed on Aug. 26, 2003, now Pat. No. 7,250,804.

(60) Provisional application No. 60/434,365, filed on Dec. 17, 2002.

(51) Int. Cl.
*H03L 5/00* (2006.01)

(52) U.S. Cl. ............... 327/308; 333/81 R; 333/103

(58) Field of Classification Search ............ 327/308; 333/81 R, 103
See application file for complete search history.

(56) References Cited

U.S. PATENT DOCUMENTS

| | | |
|---|---|---|
| 3,731,116 A | 5/1973 | Hill |
| 3,872,325 A | 3/1975 | Adams et al. |
| 4,158,149 A | 6/1979 | Otofuji |
| 4,678,929 A | 7/1987 | Alpaiwalla et al. |
| 4,742,249 A | 5/1988 | Alpaiwalla et al. |
| 5,107,152 A | 4/1992 | Jain et al. |
| 5,301,081 A | 4/1994 | Podell et al. |
| 5,705,940 A | 1/1998 | Newman et al. |
| 5,717,356 A | 2/1998 | Kohama |
| 5,767,721 A * | 6/1998 | Crampton ............ 327/308 |
| 5,818,099 A | 10/1998 | Burghartz |
| 5,818,283 A | 10/1998 | Tonami et al. |
| 6,229,370 B1 | 5/2001 | Inamori et al. |
| 6,426,525 B1 | 7/2002 | Brindle |
| 6,496,072 B2 * | 12/2002 | Cho et al. ............ 330/284 |
| 6,518,823 B1 | 2/2003 | Kswai |

(Continued)

OTHER PUBLICATIONS

"Microwave FET Tutorial", taken from FET Basics-Microwave Encyclopedia-Microwaves 101.com, pp. 1-15, Feb. 25, 2004.

*Primary Examiner*—Kenneth B. Wells
(74) *Attorney, Agent, or Firm*—Christopher P. Maiorana, PC

(57) ABSTRACT

A switch includes at least two signal ports in series with a series FET connected therebetween, and a shunt path having an FET, whereby an input bias is applied to a gate on the series FET and to a drain on the shunt FET. In one embodiment, the switch includes a control signal input, an FET connected in series across the first port and the second port, the series FET having a gate coupled to the control signal input, and a shunt path provided by an FET, the shunt FET having a drain coupled to the control signal input and to the gate of the series FET, whereby a single control signal is applied to both the series FET and the shunt FET, via the control signal input, in order to turn the series FET on and simultaneously turn the shunt FET off and, conversely, in order to turn the series FET off and simultaneously turn the shunt FET on.

18 Claims, 4 Drawing Sheets

U.S. PATENT DOCUMENTS 6,720,850 B2 4/2004 Sasabata et al.
2001/0033206 A1 10/2001 Constantine et al.
2001/0040479 A1* 11/2001 Zhang .................... 327/427

* cited by examiner

US 7,786,787 B2

SERIES/SHUNT SWITCH AND METHOD OF CONTROL

This application is a continuation application of U.S. patent application No. 10/648,022, filed Aug. 26, 2003, now U.S. Pat. No. 7,250,804, which claims priority to Provisional Application Ser. No. 60/434,365 filed Dec. 17, 2002. The contents of each of these applications are fully incorporated by reference herein.

FIELD OF THE INVENTION

The present invention relates in general to switch devices, and more particularly to a series/shunt FET switch between two signal ports.

BACKGROUND OF THE INVENTION

Conventional switch devices operate to control the path on which a signal travels. One example of a transistor-based switch is comprised of a plurality of field effect transistors (FETs). FET switches are generally known to be used in connection with high frequency signal transmission, for example, radio frequency (RF).

In general, an n-channel FET switch is in an ON state (very low impedance) allowing any signal to pass from the source to the drain of the FET until a control voltage applied to the gate of the FET falls below a predetermined amount. When the control voltage is removed, the FET switches to an OFF state (very high impedance) and prevents any signal passing from the source to the drain of the FET. The control voltage is selected such that the magnitude of the gate-to-source voltage of the FET, $V_{gs}$, rises above the magnitude of a threshold "pinchoff" voltage $V_p$. The advantage of a FET switch is that the control voltage applied to the gate of the FET draws very little current, consuming little power in performing the switching function. Switches may be combined with shunts, for example, in applications where a switch is used between two or more signal ports so as to increase isolation between the ports.

For example, FIG. 1 shows a series-shunt arm of a prior art switch. The arm includes a series path between two signal ports, as provided by a series FET 16. A shunt FET 24 provides a shunt path to enhance the isolation between the two signal ports when the arm is in an OFF state. In the OFF state, the channel of the series FET 16 is biased such that $V_{gs}$ falls below $V_p$ creating a high impedance between the two signal ports dominated by the junction capacitances of the series FET. However, the $V_{gs}$ of the shunt FET 24 is biased by V' to be above $|V_p|$, creating a low impedance path to ground. Although the series FET 16 alone provides a great deal of isolation between the two signal ports, the low impedance path to ground, as provided by the shunt FET, enhances the isolation. Since for the OFF state the bias voltage V for the series FET is below ($V_{RF1}-V_p$) and the bias voltage V' for the shunt FET is above $|V_p|$, then the equivalent logic states that control these arms are inverted from one another. Therefore, opposite logic states must be available to switch the path between the two signal ports from least attenuation to maximum isolation.

In the ON state for the series-shunt arm, the channel of the series FET 16 is biased above $V_p$ creating a low impedance between the two signal ports. However, the channel of the shunt FET 24 is biased below $V_p$ creating a high impedance path to ground. With such equivalent logic states or biases applied to the switch, minimum attenuation is achieved by decreasing the loss between the signal ports and minimizing the coupling of the signal to ground through the shunt path. Similar to the OFF state, the series and shunt FETs require opposite logic states.

FIG. 2 discloses a prior art switch similar to FIG. 1, but having a multistage configuration. The switch of FIG. 2 also requires opposite logic states for the proper biasing of the series FETs and shunt FET.

Typical control logic for such prior art switches includes various active and passive components.

A feedforward capacitor with a low impedance can be used to improve the harmonic rejection of an FET. By improving the harmonic rejection, signal distortions and noise interferences can be reduced or eliminated, and the performance of the FET structures can be improved greatly. Feedforward capacitors are often employed in designs seeking high isolation and power handling. The feedforward capacitor may be coupled across the gate of an FET and a signal port.

SUMMARY OF THE INVENTION

It is a feature of the present invention to provide a series/shunt switch which does not require inverted control logic to control the ON/OFF state of the switch.

It is a feature of the present invention to provide a series/shunt switch, and method of control, which is controlled by a common logic signal.

It is a feature of the present invention to eliminate redundant control logic components.

It is a feature of the present invention to provide a series/shunt switch device which integrates a feedforward capacitor in order to benefit from the associated advantages.

It is a feature of the present invention to provide a series/shunt switch having a reduced die size.

It is a feature of the present invention to provide a series/shunt switch which is less costly to manufacture.

The present invention therefore provides a switch having at least two signal ports in series with at least one series FET connected therebetween, and a shunt path having a FET, whereby a control voltage is applied to a gate on the series FET and to a drain on the shunt FET.

In one embodiment, the switch includes a control signal input, an FET having a current path connected in series between the first port and the second port, the FET having a control electrode or gate coupled to the control signal input, and a shunt path provided by a FET, the shunt FET having a drain coupled to the control signal input and to the gate of the series FET, whereby a single control signal is applied to both the series FET and the shunt FET, via the control signal input, in order to turn the series FET on and simultaneously turn the shunt FET off and, conversely, in order to turn the series FET off and simultaneously turn the shunt FET on.

The present invention also provides a method for switching, including the step of using a common logic signal to control both a switch and a shunt in a series arrangement.

The present invention further provides a method of controlling the coupling of a first port to a second port via a series shunt FET switch. The method includes the steps of isolating the first port from the second port, using a single control signal, by turning off the series FET. The series FET is turned off by biasing the gate-source voltage below the pinchoff voltage. During the same period, the shunt FET is turned on by biasing the gate-source voltage above the pinchoff voltage. The method also includes the step of coupling the first port to the second port, using a single control signal, by turning on the series FET. The series FET is turned on by biasing the gate-source voltage above the pinchoff voltage. During the same period, the shunt FET is turned off by biasing the gate-source voltage below the pinchoff voltage.

BRIEF DESCRIPTION OF THE DRAWINGS

These and other aspects of the invention and their advantages will be discerned in the following detailed description when read in conjunction with the drawings, in which like parts are denoted by like characters and in which.

DETAILED DESCRIPTION OF ILLUSTRATED EMBODIMENT

Figure 1:
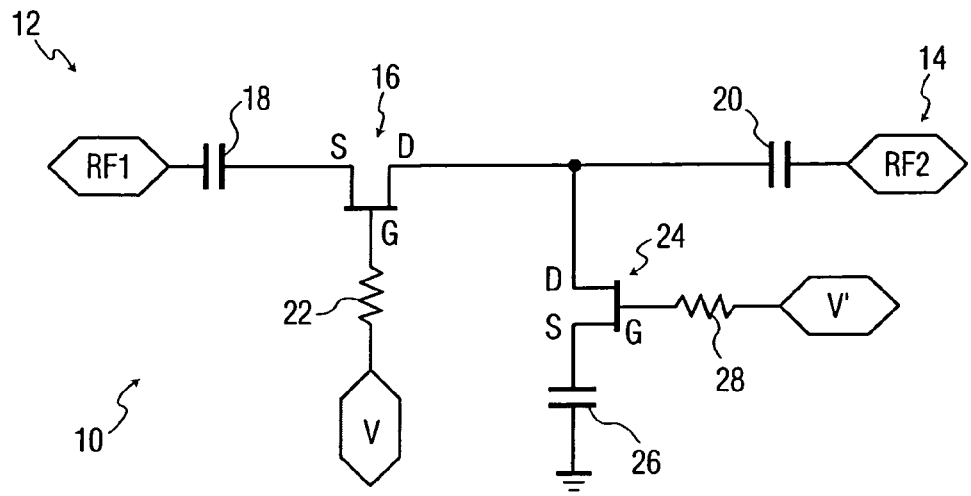
FIG. 1 is a schematic diagram of a prior art series/shunt arm of a switch.
Figure 2:
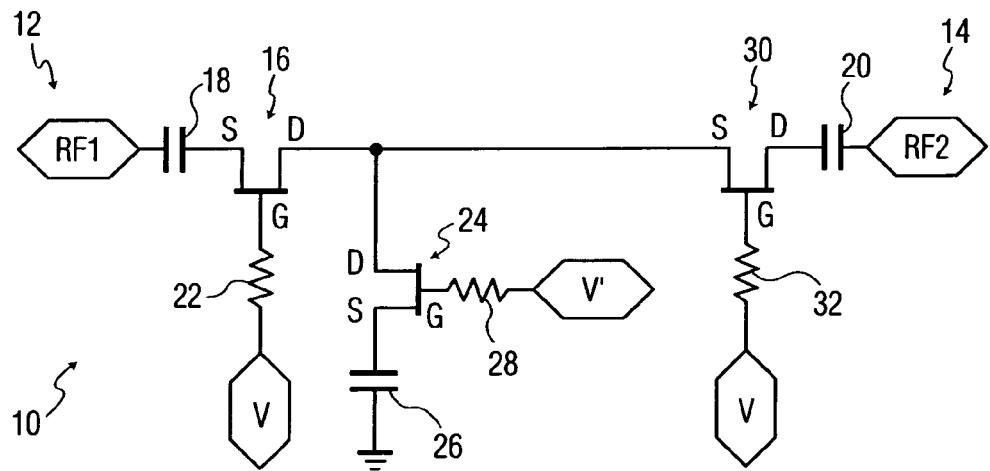
FIG. 2 is a schematic diagram of a prior art switch similar to FIG. 1, but in a multi-gate configuration.

FIG. 1 discloses a prior art switch 10 having a first signal port 12 coupled to a second signal port 14 via a series FET 16. The series FET 16 includes a drain, source and gate. The source of FET 16 is coupled to the first port 12 via series capacitor 18 and the drain is coupled to the second port 14 via series capacitor 20. The gate is coupled to a control voltage V via a resistor 22. A shunt FET 24 includes a source, drain and gate. The source of the shunt FET 24 is coupled to a ground reference via a capacitor 26. The drain of the shunt FET 24 is coupled to the drain of the series FET 16. The gate of the shunt FET 24 is coupled to a control voltage V' via a resistor 28. FIG. 2 is similar to the prior art switch 10 of FIG. 1, but in a multi-gate configuration. In particular, the switch 10' of FIG. 2 further includes a second series FET 30. The second series FET 30 includes a drain, source and gate. The gate is coupled to a control voltage V via a resistor 32.

Figure 3:
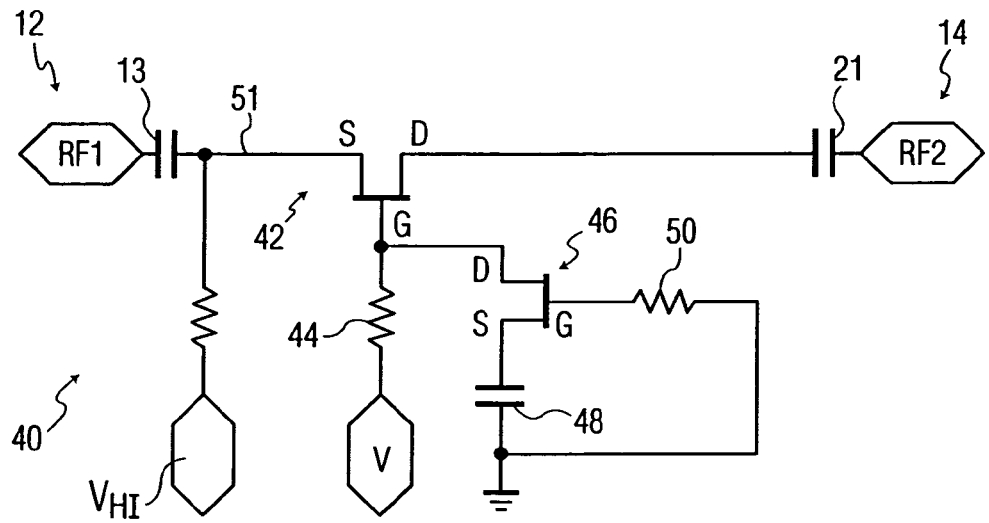
FIG. 3 is a schematic diagram of a switch in accordance with the present invention.

FIG. 3 illustrates a first embodiment of the invention. A switch indicated generally at 40 includes a switching transistor 42 having a current path and a control electrode. In the illustrated embodiment, transistor 42 is a series FET 42 having a source, drain and gate. The source of the series FET 42 is coupled to the first signal port 12 through signal path 51 and capacitor 13. The drain of the series FET 42 is coupled to the second signal port 14 through blocking capacitor 21. The gate or control electrode of the series FET 42 is coupled to control signal bias voltage V via a resistor 44. A shunt transistor 46 provides a switchable path coupling the gate or control electrode of switching transistor 42 to a ground reference. Shunt FET 46 includes a drain, source and gate. The drain of the shunt FET 46 is coupled to the gate of the series FET 42. The source of the shunt FET 46 is coupled to a ground reference via a capacitor 48. The gate of the shunt FET 46 is coupled to a ground reference via a resistor 50. During transmission of a signal from port 12 to port 14, or vice versa, a voltage Vhi relative to ground is placed on signal path 51. When any bias applied to V is less than $V_p$ below Vhi (e.g., 0V, when Vhi>$V_p$), then the series FET 42 will turn off. Simultaneously, the shunt FET 46 will turn on as long as V is biased above $|V_p|$ ($V_{gs}=0-V>V_p =>$shunt device on). When any bias applied to V is greater than $|V_p|$ below Vhi (e.g., Vhi), then the series FET 42 will turn on. Simultaneously, the shunt FET 46 will turn off as long as V is biased>$|V_p|$ (e.g. $V_{gs}=0-V<V_p =>$shunt device off).

Thus the FETs are turned on and off through the gate-source voltage bias. The schematic shown in FIG. 3 allows the control signal V to be applied to the gate on the series FET 42 and conversely to the drain on the shunt FET 46. This technique allows for the same control signal to have the opposite effect on each respective device and so for a common logic signal to control both a series and shunt device on a common path.

When the series FET 42 is off, the gate-source and gate-drain junction capacitances dominate the impedance of the device (high impedance state). Simultaneously, FET 46 is on when FET 42 is off, enhancing the isolation to port 14 by shunting the signal from port 12 to ground. When the series FET 42 is on, the low impedance of its channel dominates and provides a path for the signal to flow from the first signal port 12 to the second signal port 14. At the same time, the shunt FET 46 is off, which further reduces the loss through the shunt path to ground.

Figure 4:
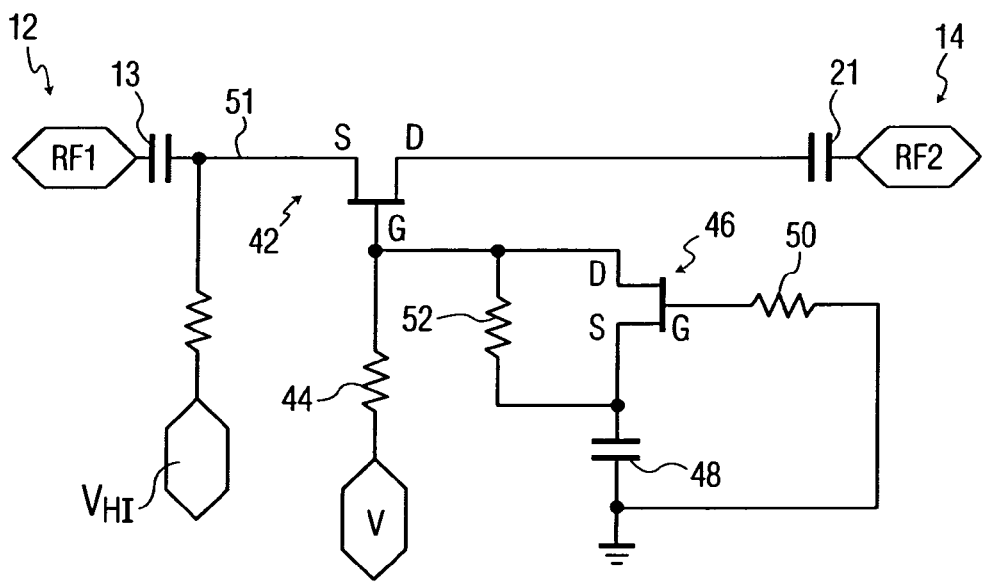
FIG. 4 is a schematic diagram of a switch in accordance with a further embodiment of the present invention.

FIG. 4 is a schematic diagram of the switch of FIG. 3, in a modified embodiment. The switch of FIG. 4 further includes a resistor 52 which is coupled across the source and drain of the shunt FET 46. This sharpens the timing of the switching of shunt FET 46 between an ON and OFF state.

Figure 5:
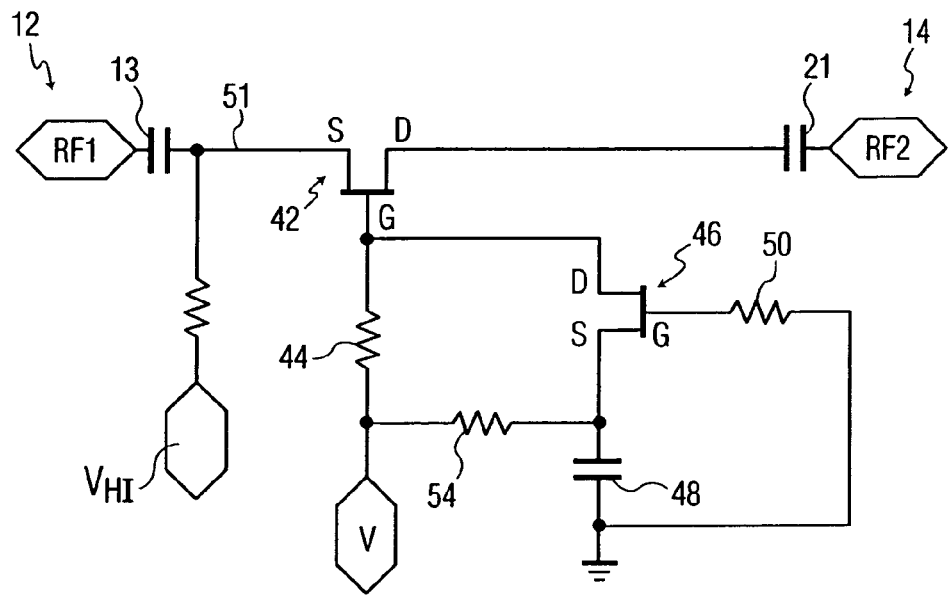
FIG. 5 is a schematic diagram of a switch in accordance with yet a further embodiment of the present invention.

FIG. 5 is a schematic of a switch similar to FIG 3, but in a further modified embodiment. FIG. 5 further includes a resistor 54 which is coupled across the source of the shunt FET 46 and the bias or control voltage V.

In other embodiments, any desired plurality of series paths may be implemented using similar techniques as those shown in the embodiment of FIG. 3. Embodiments may be scaled for multi-gate devices or multiple series FETs. Additionally, it should be noted, redistributing the RF voltage across the junction capacitors in a manner similar to what would be present in a design with feedforward capacitors, the shunt FET application in FIG. 3 can also aid in power handling.

Figure 6:
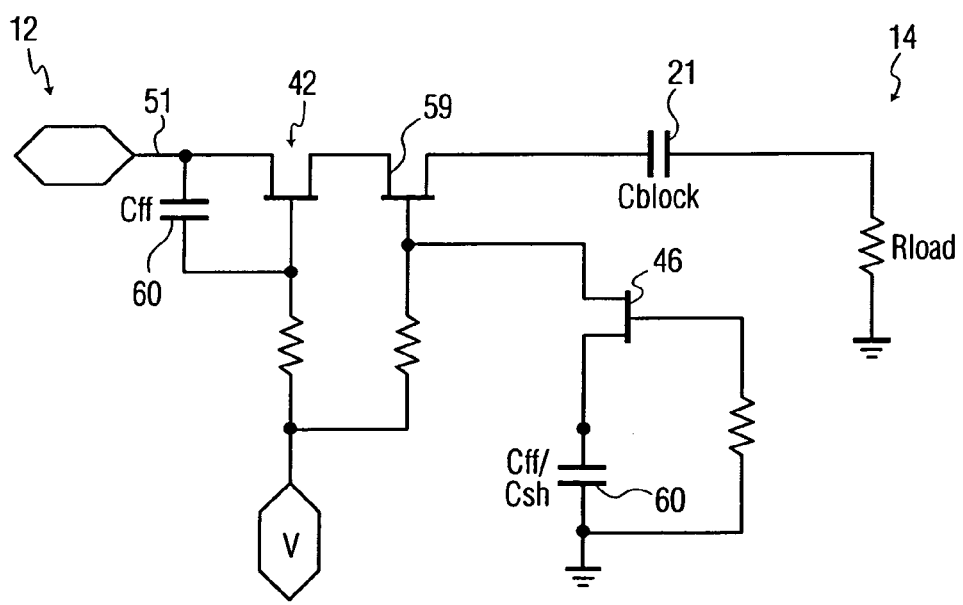
FIG. 6 is a schematic diagram of a switch in accordance with the present invention, in a multi-gate configuration, and used feedforward capacitors.

Additionally, embodiments using feedforward capacitors for power handling may also use similar techniques to those shown in FIG. 3. For example, as shown by FIG. 6, feedforward capacitors 60 are connected to the shunt paths of the series/shunt switch arms. FIG. 6 also shows the employment of an additional series FET 59 to permit a relatively low control voltage without increasing die or periphery size.

Figure 7:
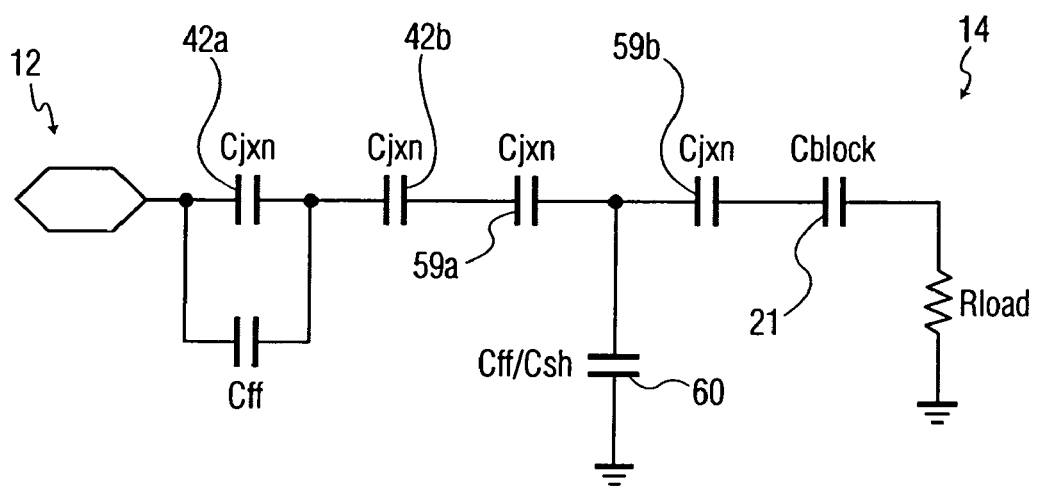
FIG. 7 is a schematic representation of the circuit shown in FIG. 6, showing gate-source and gate-drain junction capacitances of the series FETs in an OFF state.

A further advantage of the present invention is that the use of a shunt FET connected to the gate provides a "short" across a junction capacitance to ground similar to that which is present with feedforward capacitors. FIG. 7 is a diagram of the circuit shown in FIG. 6 showing the gate-source and gate-drain junction capacitances in the series FETs' OFF state being represented by capacitors. This model demonstrates that the blocking capacitor (Cff/Csh) 60 performs a number of tasks more or less simultaneously: a DC block for the shunt arm; a low impedance for high isolation; and the equivalent feedforward capacitance for power handling. Of course, in other embodiments, one or more of these tasks may not be desired and the embodiment may be modified as appropriate and/or necessary.

Further, in embodiments where high isolation and power handling are desired, minimal die space is used.

The illustrated embodiments of the present invention use metal semiconductor field-effect transistors (MESFETs) as the solid state switching devices employed. However the present invention has application to circuits using junction field-effect transistors (JFETs), metal-oxide field-effect transistors (MOSFETs), high electron mobility transistors (HEMTs), pseudomorphic high electron mobility field-effect transistors (PHEMTs), and other variants of field-effect transistor (FETs) devices.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed:

1. An integrated circuit for selectively connecting and disconnecting a first RF signal port to a second RF signal port comprising:
   a signal path between the first RF port and the second RF signal port;
   at least one switching field effect transistor having a signal path coupled between the first RF signal port and the second RF signal port and a control electrode;
   a shunt transistor having a current path with a first end coupled directly to the control terminal of the at least one switching transistor without intervening elements and a second end coupled to a low impedance path to a ground reference for the signal path and a control electrode coupled to the ground reference through an impedance; and
   a control voltage having at least a first state and a second state for controlling an on/off state of the at least one switching transistor and the shunt transistor, the control voltage coupled to the control electrode of the at least one switching transistor and to the current path of the shunt transistor.

2. The integrated circuit of claim 1, wherein the at least one switching transistor includes a first series field effect transistor having a signal path with one end coupled to the first RF port, a second series field effect transistor having a signal path with one end coupled to the second RF port, the control voltage connected to the control electrodes of each of the first and second series field effect transistors and the first end of the current path of the shunt transistor connected to the control terminal of the second series field effect transistor, the integrated circuit further comprising a feed-forward capacitor coupled between the first RF port and the control electrode of the first series effect transistor, and said shunt transistor comprising a field effect transistor.

3. The integrated circuit of claim 2, wherein the low impedance path between the second end of the current path of the shunt transistor and the ground reference of the signal path comprises a shunt capacitor that acts as a second feed-forward capacitor associated with the second series field effect transistor.

4. The integrated circuit of claim 1, wherein the first end of the shunt transistor and the control terminal of the at least one switching transistor are coupled to the control voltage through a resistor.

5. The integrated circuit of claim 2, wherein the control electrode of the first series field effect transistor is coupled to the control voltage through a first resistor and the control electrode of the second series field effect transistor is coupled to the control voltage through a second resistor.

6. The integrated circuit of claim 5, wherein the first end of the current path of the shunt transistor is coupled to the same node as the control electrode of the second series field effect transistor without any intervening elements.

7. The integrated circuit of claim 2, wherein the first end of the current path of the shunt transistor is coupled to the same node as the control electrode of the second series field effect transistor without any intervening elements.

8. The integrated circuit of claim 5, wherein the low impedance path between the second end of the current path of the shunt transistor and the ground reference of the signal path comprises a shunt capacitor that acts as a second feed-forward capacitor associated with the second series field effect transistor.

9. The integrated circuit of claim 6, wherein the low impedance path between the second end of the current path of the shunt transistor and the ground reference of the signal path comprises a shunt capacitor that acts as a second feed-forward capacitor associated with the second series field effect transistor.

10. The integrated circuit of claim 1, wherein the low impedance path between the second end of the current path of the shunt transistor and the ground reference of the signal path comprises a shunt capacitor that acts as a feed-forward capacitor associated with the second series field effect transistor.

11. An integrated circuit for selectively connecting and disconnecting a first RF signal port to a second RF signal port comprising:
    a signal path between the first RF port and the second RF signal port;
    at least one switching field effect transistor having a signal path coupled between the first RF signal port and the second RF signal port and a control electrode;
    a shunt transistor having a current path with a first end coupled to the control terminal of the switching transistor without intervening elements and a second end coupled through a low impedance path to a ground reference for the signal path and a control electrode coupled to the ground reference through an impedance; and
    a control voltage having at least a first state and a second state for controlling an on/off state of the at least one switching transistor and the shunt transistor, the control voltage coupled to the control electrode of the at least one switching transistor and to the current path of the shunt transistor.

12. The integrated circuit of claim 11, wherein the at least one switching transistor includes a first series field effect transistor having a signal path with one end coupled to the first RF port, a second series field effect transistor having a signal path with one end coupled to the second RF port, the control voltage connected to the control electrodes of each of the first and second series field effect transistors and wherein the first end of the current path of the shunt transistor is connected to the control terminal of the second series field effect transistor without intervening elements, the integrated circuit further comprises a feed-forward capacitor coupled between the first RF port and the control electrode of the first series field effect transistor, and said shunt transistor comprises a field effect transistor.

13. The integrated circuit of claim 12, wherein the low impedance path between the second end of the current path of the shunt transistor and the ground reference of the signal path comprises a shunt capacitor that acts as a second feed-forward capacitor associated with the second series field effect transistor.

14. The integrated circuit of claim 11, wherein the current path of the shunt transistor is not connected to the current path of the at least one switching transistor.

15. The integrated circuit of claim 14, wherein the control electrode of the at least one switching transistor and the first end of the current path of the shunt transistor are connected to the control voltage through a resistor.

16. The integrated circuit of claim 12, wherein the control electrode of the first series field effect transistor is coupled to the control voltage through a first resistor and the control electrode of the second series field effect transistor is coupled to the control voltage through a second resistor.

17. The integrated circuit of claim 16, wherein the low impedance path between the second end of the current path of the shunt transistor and the ground reference of the signal path comprises a shunt capacitor that acts as a second feed-forward capacitor associated with the second series field effect transistor.

18. The integrated circuit of claim 11, wherein the low impedance path between the second end of the current path of the shunt transistor and the ground reference of the signal path comprises a shunt capacitor that acts as a second feed-forward capacitor associated with the second series field effect transistor.

* * * * *